United States Patent
Pushp et al.

(10) Patent No.: US 12,488,994 B2
(45) Date of Patent: Dec. 2, 2025

(54) MAGNESIUM OXIDE BASED HARDMASK FOR REACTIVE ION ETCHING

(71) Applicants: International Business Machines Corporation, Armonk, NY (US); École Supérieure de Physique et de Chimie Industrielles, Paris (FR)

(72) Inventors: Aakash Pushp, San Jose, CA (US); M A Mueed, San Jose, CA (US); Benjamin Madon, Cupertino, CA (US); Noel Arellano, Gilroy, CA (US); Krystelle Lionti, San Jose, CA (US); Gregory Michael Wallraff, San Jose, CA (US); Anthony Bock Fong, San Jose, CA (US); Brian Peter Hughes, San Jose, CA (US); Vincent Ouazan-Reboul, Gottingen (DE)

(73) Assignee: International Business Machines Corporation, Armonk, NY (US)

( * ) Notice: Subject to any disclaimer, the term of this patent is extended or adjusted under 35 U.S.C. 154(b) by 801 days.

(21) Appl. No.: 17/452,702

(22) Filed: Oct. 28, 2021

(65) Prior Publication Data
US 2023/0137983 A1    May 4, 2023

(51) Int. Cl.
*H01L 21/311*    (2006.01)
*G03F 7/20*    (2006.01)
(Continued)

(52) U.S. Cl.
CPC .......... *H01L 21/31144* (2013.01); *G03F 7/20* (2013.01); *H01L 21/0274* (2013.01);
(Continued)

(58) Field of Classification Search
None
See application file for complete search history.

(56) References Cited

U.S. PATENT DOCUMENTS

| | | |
|---|---|---|
| 4,132,586 A | 1/1979 | Schaible |
| 4,352,716 A | 10/1982 | Schaible |
| (Continued) | | |

FOREIGN PATENT DOCUMENTS

| | | | |
|---|---|---|---|
| CN | 104810268 A | 7/2015 | |
| JP | 2008053473 A | * 3/2008 | ........... H01L 21/306 |

OTHER PUBLICATIONS

"Impact of photoelectron and secondary electron travel on resolution", Wikipedia, Extreme ultraviolet lithography, page was last edited on May 31, 2021, 1 page, <https://en.wikipedia.org/wiki/Extreme_ultraviolet_lithography#Impact_of_photoelectron_and_secondary_electron_travel_on_resolution>.

(Continued)

*Primary Examiner* — Brent A. Fairbanks
*Assistant Examiner* — Derek L Nielsen
(74) *Attorney, Agent, or Firm* — Kelsey M. Skodje

(57) ABSTRACT

Forming a hardmask layer for reactive ion etching includes depositing a hardmask above an underlayer. The hardmask includes a layer of magnesium oxide having a thickness of up to 10 nm. A resist layer is deposited above the hardmask and developed to form a pattern that exposes portions of the hardmask. The pattern is transferred from the resist layer to the hardmask by rinsing exposed portions of the hardmask with a deionized water solution.

20 Claims, 2 Drawing Sheets

(51) Int. Cl.
*H01L 21/027* (2006.01)
*H01L 21/033* (2006.01)

(52) U.S. Cl.
CPC ...... *H01L 21/0332* (2013.01); *H01L 21/0337* (2013.01); *H01L 21/31116* (2013.01)

(56) References Cited

U.S. PATENT DOCUMENTS

| | | |
|---|---|---|
| 8,333,899 B2 | 12/2012 | Sakurai |
| 2004/0191697 A1 | 9/2004 | Nakatsuka |
| 2011/0235212 A1* | 9/2011 | Sakurai ................ G11B 5/855 |
| 2012/0223418 A1* | 9/2012 | Stowers ............. H01L 21/0332 |
| | | 257/632 |
| 2018/0366386 A1* | 12/2018 | Petz ................... H01L 21/0332 |

OTHER PUBLICATIONS

Vermilyea, David A., "The Dissolution of MgO and Mg ( OH ) 2 in Aqueous Solutions", Journal of The Electrochemical Society, vol. 116, No. 9, 1969, pp. 1179-1183, <https://iopscience.iop.org/article/10.1149/1.2412273/pdf>.

* cited by examiner

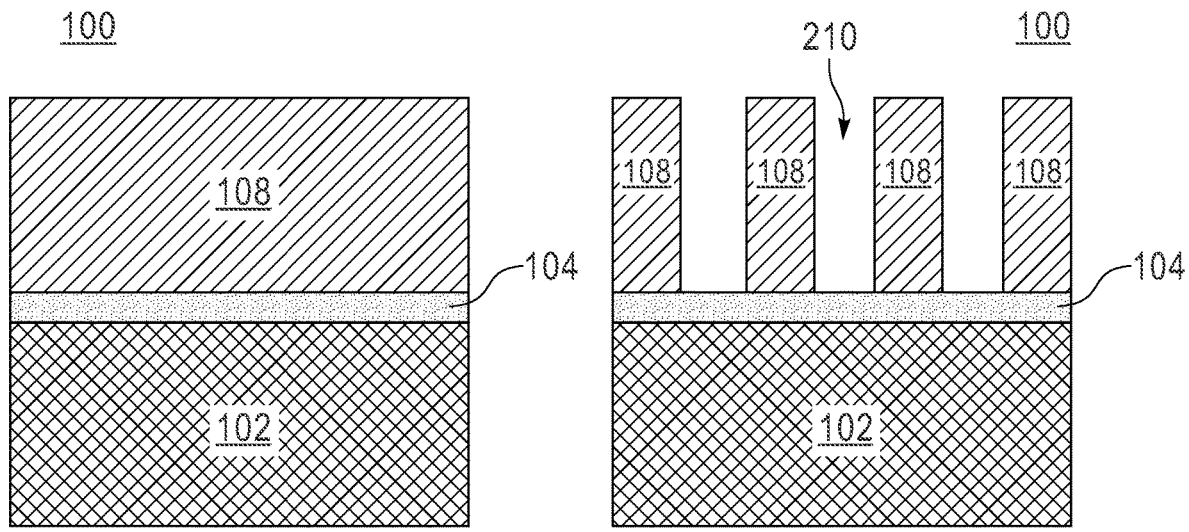
FIG. 1
FIG. 2
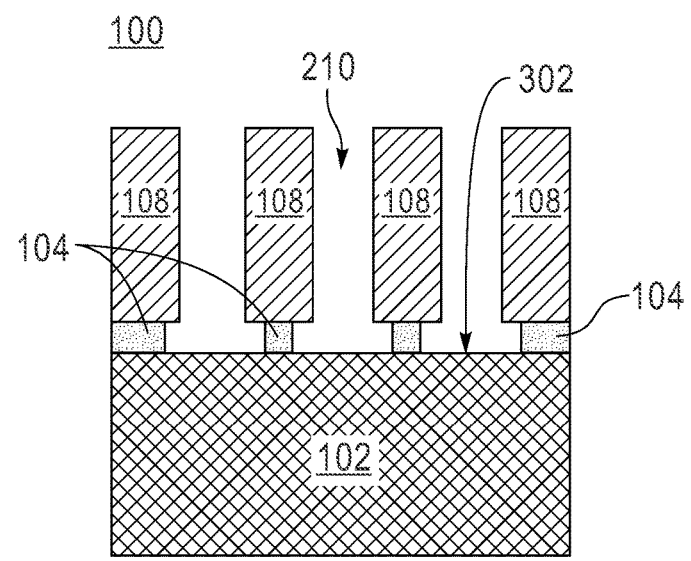
FIG. 3

MAGNESIUM OXIDE BASED HARDMASK FOR REACTIVE ION ETCHING

BACKGROUND

The present invention generally relates to the field of semiconductor devices, and more particularly to a magnesium oxide-based hardmask for reactive ion etching.

Photolithography and electron-beam lithography are the most commonly used lithography techniques for preparing high-resolution patterns. The success of these methods is highly dependent on the processing of the resist layer. A resist material needs to satisfy requirements on resolution, exposure sensitivity, contrast, line-edge roughness, depth-of-focus, and etch resistance. To satisfy the requirements of both resolution and line-edge roughness, the resist layer must be thin. However, in both techniques, as a result of different physical limitations, the thickness of the resist layer suitable for high-resolution patterning is limited. Issues associated with pattern collapse also effectively limit the thickness of resist films.

Significantly, the limit on the resist layer thickness runs contrary to the needs of pattern transfer to a substrate by plasma etching or ion milling. Most resist materials erode significantly and fairly quickly relative to the substrate during plasma etching or milling. If the resist layer is too thin, then the pattern cannot be etched deeply into the substrate using solely the resist layer as the etch mask. Accordingly, the thinness of lithography resists can limit the fabrication of high aspect-ratio structures. To overcome this problem, the resist pattern is usually transferred to a hard mask layer that provides greater etch resistance. However, hardmask characteristics including thickness, etch selectivity, etch resistance, and removal can complicate the fabrication process and lead to additional resolution and line-edge roughness.

SUMMARY

According to an embodiment of the present disclosure, forming a semiconductor structure includes depositing a hardmask above an underlayer, the hardmask includes a layer of magnesium oxide having a thickness of up to 10 nm, depositing a resist layer above the hardmask, developing the resist layer to form a pattern that exposes top portions of the hardmask, and transferring the pattern from the resist layer to the hardmask by rinsing exposed portions of the hardmask with a deionized water solution. According to an embodiment, rinsing the exposed portions of the hardmask with the deionized water solution is performed for up to 15 min with or without ultrasonic agitation. The method further includes removing the resist layer, etching the exposed portions of the underlayer to form a plurality of trenches within the underlayer having an aspect ratio of at least 5:1 using a reactive ion etching chemistry including a fluorinated gas such as sulfur hexafluoride, and removing remaining portions of the hardmask by applying a rinsing solution including deionized water.

In some embodiments, transferring the pattern from the resist layer to the hardmask includes conducting a soft ion-milling process, and a temperature of the deionized water is increased and kept below a boiling point of the deionized water. Further, the rinsing solution includes an acidic solvent, such as hydrogen fluoride, for improving a dissolution of the remaining portions of the hardmask.

According to another embodiment of the present disclosure, a method of forming a semiconductor structure includes depositing a hardmask layer above an underlayer, the hardmask layer includes a layer of magnesium oxide having a thickness of up to 10 nm, depositing a resist layer above the hardmask layer for patterning the hardmask layer, patterning the hardmask layer by etching the layer of magnesium oxide, the etching forming a first plurality of trenches in the hardmask layer that exposes portions of the underlayer, etching the exposed portions of the underlayer to form a second plurality of trenches having an aspect ratio of at least 5:1, and removing remaining portions of the hardmask layer by rinsing the remaining portions of the hardmask layer with a rinsing solution.

Etching of the layer of magnesium oxide is performed via at least one of rinsing the hardmask layer with a deionized water solution and performing a soft ion-milling process. In an embodiment, rinsing the hardmask layer with the deionized water solution is performed for up to 15 min with or without ultrasonic agitation, and etching the exposed portions of the underlayer is conducted using a reactive ion etching chemistry including a fluorinated gas such as sulfur hexafluoride. Preferably, the rinsing solution includes at least one of deionized water kept at a temperature below the boiling point of the deionized water and a hydrogen fluoride-based solvent for improving dissolution of the remaining portions of the hardmask layer.

According to yet another embodiment of the present disclosure, a method of forming a semiconductor structure includes depositing a hardmask layer above a semiconductor substrate, the hardmask layer includes a layer of magnesium oxide having a thickness of up to 10 nm, depositing a resist layer above the hardmask layer for patterning the hardmask layer, patterning the hardmask layer by etching the layer of magnesium oxide, the etching is performed by at least one of rinsing the hardmask layer with a deionized water solution, ultrasonic agitation and performing a soft ion-milling process, the etching forms a first plurality of trenches in the hardmask layer that exposes portions of the underlayer, etching the exposed portions of the semiconductor substrate to form a second plurality of trenches having an aspect ratio of at least 5:1 using a reactive ion etching chemistry comprising a fluorinated gas including sulfur hexafluoride, and removing remaining portions of the hardmask layer by rinsing the remaining portions of the hardmask layer with a rinsing solution including at least one of deionized water kept at a temperature below the boiling point of the deionized water, ultrasonic agitation, and a hydrogen fluoride-based solvent for improving dissolution of the remaining portions of the hardmask layer.

BRIEF DESCRIPTION OF THE DRAWINGS

The following detailed description, given by way of example and not intended to limit the invention solely thereto, will best be appreciated in conjunction with the accompanying drawings, in which:

FIG. 1 is a cross-sectional view of a semiconductor structure after forming a hardmask layer and a resist layer on an underlayer, according to an embodiment of the present disclosure;

FIG. 2 is a cross-sectional view of the semiconductor structure after resist lithography and developing, according to an embodiment of the present disclosure;

FIG. 3 is a cross-sectional view of the semiconductor structure after transferring a pattern to the hardmask layer, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 4:
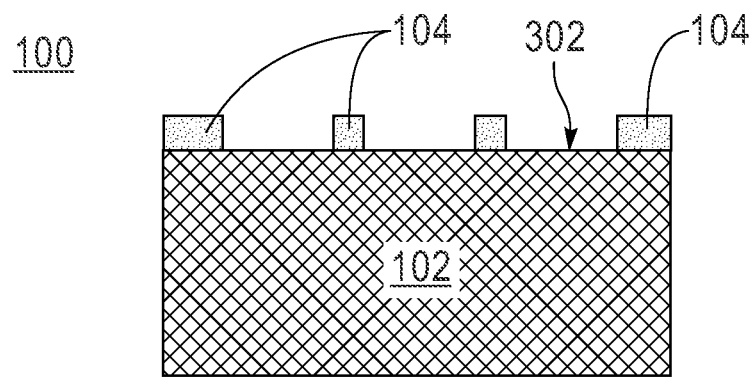
FIG. 4 is a cross-sectional view of the semiconductor structure after removing the resist layer, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Transferring a resist pattern to a hardmask layer that provides greater etch resistance can help overcoming problems associated with thinness of lithography resists and fabrication of high aspect-ratio structures. However, hardmask characteristics including thickness, etch selectivity, etch resistance, and removal can complicate the fabrication process and lead to additional resolution and line-edge roughness.

As integrated circuit fabrication continues to strive to produce smaller and denser integrated circuits, a viable alternative for 5 nm node technology and beyond includes using an ultrathin (<10 nm thick) film of magnesium oxide (MgO) as the hardmask layer. This ultrathin MgO film can efficiently act as hardmask material by providing a high etch selectivity to silicon and silicon dioxide as well as an excellent etch resistance to reactive ion etch (RIE) chemistry. This can improve transferring the pattern to the underlying (silicon) substrate (i.e., improved pattern resolution) and the formation of substrate vias with a high aspect ratio.

Additionally, the proposed ultrathin MgO film can be easily dissolved in deionized (DI) water, which facilitates hardmask removal and prevents over etching of the underlying substrate.

Therefore, embodiments of the present disclosure provide a MgO-based hardmask layer for reactive ion etching including an ultrathin layer of MgO formed between a resist layer and an underlayer. The MgO-based hardmask layer can improve pattern transfer resolution and hardmask removal as well as an aspect ratio of substrate vias (or trenches). Embodiments by which the MgO-based hardmask layer can be formed and implemented are described in detailed below by referring to the accompanying drawings in FIGS. 1-6. It may be understood that embodiments of the present disclosure are capable of being implemented in conjunction with any type of semiconductor device now known or later developed.

Referring now to FIG. 1, a cross-sectional view of a semiconductor structure 100 during a semiconductor manufacturing process is shown, according to an embodiment of the present disclosure. At this step of the manufacturing process, the semiconductor structure 100 includes an underlayer 102, a hardmask layer 104 directly above the underlayer 102, and a resist layer 108 directly above the hardmask layer 104. The underlayer 102 can be, for example, a semiconductor substrate such as a bulk semiconductor structure or a semiconductor-on-insulator structure. More specifically, the underlayer 102 can be any suitable substrate material, such as, for example, monocrystalline Si, SiGe, SiC, III-V compound semiconductor, II-VI compound semiconductor, or semiconductor-on-insulator (SOI). In some embodiments, the underlayer 102 can include a metal layer or a combination of metal and semiconductor materials. In this particular embodiment, the underlayer 102 is made of silicon dioxide ($SiO_2$) with a (vertical) thickness of approximately 1 mm.

According to an embodiment, the hardmask layer 104 formed above the underlayer 102 includes an ultrathin layer of magnesium oxide (MgO). Examples of various thin film growth techniques that can be implemented to form the hardmask layer 104 may include ion-beam-assisted deposition (IBAD), magnetron sputtering, metal organic chemical vapor deposition (MOCVD), and electron beam evaporation. The hardmask layer 104 may have a thickness of up to approximately 10 nm. Preferably, the thickness of the hardmask layer 104 may vary from approximately 1 nm to approximately 10 nm and ranges therebetween, although a thickness less than 1 nm and greater than 10 nm may be acceptable.

With continued reference to FIG. 1, the resist layer 108 may include an electron-sensitive film such as polymethyl methacrylate (PMMA) resist layer. As known by those skilled in the art, PMMA is widely used as an electron beam resist. According to an embodiment, the resist layer 108, made of PMMA, is deposited above the hardmask layer 104 using, for example, spin-coating techniques. A thickness of the resist layer 108 may vary from approximately 10 nm and approximately 2 mm, and ranges therebetween.

Referring now to FIG. 2, a cross-sectional view of the semiconductor structure 100 after resist lithography and developing is shown, according to an embodiment of the present disclosure. In this embodiment, an electron-beam lithography (often abbreviated as e-beam lithography) is performed on the semiconductor structure 100 to pattern the resist layer 108. As known by those skilled in the art, the electron beam alters the solubility of the electron-sensitive film forming the resist layer 108, thus enabling selective removal of either exposed or non-exposed regions of the resist layer 108 by immersing it in a solvent (developer).

Different developers can be used with PMMA, these may include varying mixtures of methyl-isobutyl-ketone (MIBK) and isopropanol (IPA) depending on what resolution and throughput is required. Preferably, in this embodiment, the developer solution includes a mixture of IPA and deionized (DI) water.

After the resist lithography and developing steps, a pattern consisting of a first plurality of trenches or recesses 210 (hereinafter "first trenches") is formed on the resist layer 108. The first trenches 210 expose portions of the hardmask layer 104, as shown in the figure.

Referring now to FIG. 3, a cross-sectional view of the semiconductor structure 100 after transferring the pattern to the hardmask layer 104 is shown, according to an embodiment of the present disclosure. As depicted in the figure, transferring the pattern from the resist layer 108 to the hardmask layer 104 further extends the first trenches 210. The extended first trenches 210 expose a top surface 302 of the underlayer 102. Alternatively or additionally, the hardmask layer 104 can be laterally over etched during the pattern transferring process, as can be observed in the figure.

According to an embodiment, the pattern including the first trenches 210 is transferred to the hardmask layer 104 by rinsing the hardmask layer 104 with a DI water solution for a determined period of time. In an exemplary embodiment, the hardmask layer 104 is left in the DI water for up to 15 minutes at room temperature. The rinsing of the hardmask layer 104 can be performed with or without ultrasonic agitation. It should be noted that the DI water is capable of dissolving substantially all of the exposed portions of the hardmask layer 104. As known by those skilled in the art, MgO dissolves in DI water at a rate of approximately 1 nm/min at room temperature after converting into magnesium hydroxide ($Mg(OH)_2$).

It should be noted that in embodiments in which lateral over etch of the hardmask layer 104 is undesirable, a soft ion-milling process can be used to transfer the resist pattern to the hardmask layer 104 instead of the DI water solution.

Referring now to FIG. 4, a cross-sectional view of the semiconductor structure 100 is shown after removing the resist layer 108, according to an embodiment of the present disclosure. In this embodiment, any suitable stripping or lift-off method can be used to remove the resist layer 108. Preferably, an organic solvent such as N-methyl-2-pyrrolidone (NMP) is used to remove the resist layer 108 such that only the ultrathin (MgO) hardmask layer 104 remains in the semiconductor structure 100.

Figure 5:
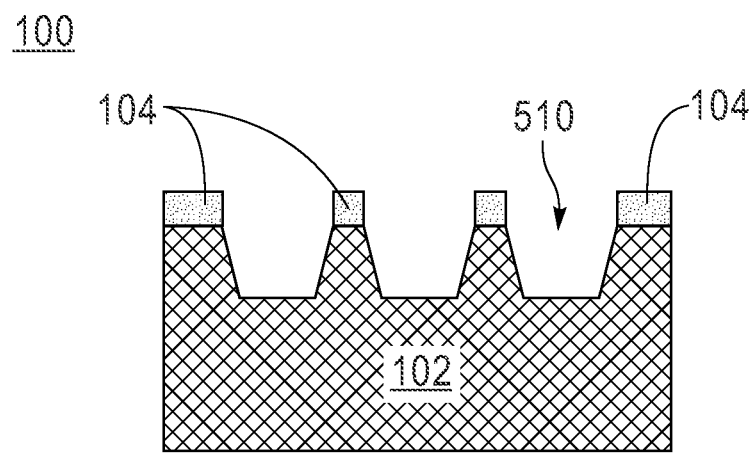
FIG. 5 is a cross-sectional view of the semiconductor structure after etching the semiconductor substrate, according to an embodiment of the present disclosure.

Referring now to FIG. 5, a cross-sectional view of the semiconductor structure 100 is shown after etching the underlayer 102, according to an embodiment of the present disclosure. As depicted in the figure, portions of the underlayer 102 are etched using any suitable etching technique. For example, the underlayer 102 can be etched by standard reactive ion etching (RIE) using plasma (e.g., $SF_6$). Here, it should be noted that the RIE process can be conducted using any fluorinated gas including sulfur hexafluoride ($SF_6$). A second plurality of trenches 510 (hereinafter "second trenches") are formed in the underlayer 102 during the etching step.

Figure 6:
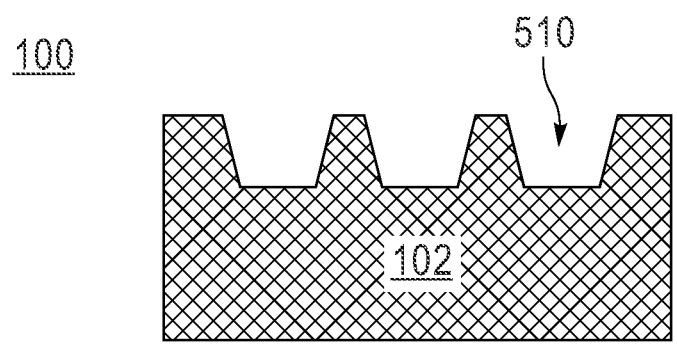
FIG. 6 is a cross-sectional view of the semiconductor structure after removing the hardmask layer, according to an embodiment of the present disclosure.

Referring now to FIG. 6, a cross-sectional view of the semiconductor structure 100 is shown after removing the hardmask layer 104, according to an embodiment of the present disclosure. In this embodiment, a DI water rinse is used to remove the hardmask layer 104. As mentioned above, the DI water rinse is capable of removing substantially all remaining portions of the hardmask layer 104 from the semiconductor structure 100 by dissolving the ultrathin MgO layer.

Alternatively or additionally, a temperature of the DI water rinse used to remove the hardmask layer 104 can be increased and maintained below a boiling point of the DI water rinse. For example, the temperature of the DI water rinse can be kept at approximately 80° C. to approximately 90° C. The increased temperature of the DI water rinse may accelerate the dissolution of the ultrathin MgO film forming the hardmask layer 104.

In other embodiments, a (slightly) acidic solvent may be used to remove the hardmask layer 104 from the semiconductor structure 100. The ultrathin MgO layer (i.e., hardmask layer 104) may dissolve faster in the acidic solvent than in the DI water rinse. In such embodiments, for example, a hydrogen fluoride (HF) based solvent can be used to remove the hardmask layer 104.

Therefore, embodiments of the present disclosure provide a method for using an ultrathin MgO film as hardmask material that provides high etch selectivity to silicon and silicon dioxide as well as an excellent etch resistance to RIE chemistry, thereby improving pattern resolution and the formation of substrate vias with a high aspect ratio in addition to facilitating hardmask removal and preventing over etching of the underlayer 102.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a hardmask directly above an underlayer, wherein the hardmask is a layer of magnesium oxide (MgO) having a thickness between 1 nm and 5 nm, and wherein the forming comprises forming the layer of MgO on the underlayer using a technique selected from the group consisting of ion-beam-assisted deposition, magnetron sputtering, metal organic chemical vapor deposition, and electron beam evaporation;
   depositing a resist layer directly above the hardmask;
   developing the resist layer to form a pattern, wherein portions of the hardmask are exposed after developing the resist layer; and
   transferring the pattern from the resist layer to the hardmask by rinsing the exposed portions of the hardmask with deionized water at room temperature to remove the exposed portions of the hardmask and expose portions of the underlayer.

2. The method of claim 1, wherein the resist layer comprises a polymethyl methacrylate resist layer.

3. The method of claim 1, wherein the rinsing the exposed portions of the hardmask is performed for 1-15 min with or without ultrasonic agitation.

4. The method of claim 1, further comprising:
removing the patterned resist layer;
etching the exposed portions of the underlayer; and
removing remaining portions of the hardmask.

5. The method of claim 4, wherein the etching the exposed portions of the underlayer forms a plurality of trenches within the underlayer having an aspect ratio of 5:1.

6. The method of claim 4, wherein the etching the exposed portions of the underlayer is conducted using reactive ion etching with a fluorinated gas including sulfur hexafluoride.

7. The method of claim 4, wherein the removing the remaining portions of the hardmask comprises:
applying a rinsing solution comprising deionized water.

8. The method of claim 7, wherein a temperature of the solution is between 30° C. and 99° C.

9. The method of claim 7, wherein the rinsing solution has a pH below 7.

10. The method of claim 9, wherein the rinsing solution further comprises hydrofluoric acid.

11. The method of claim 1, wherein the resist layer is a layer of polymethyl methacrylate (PMMA) with a thickness between 10 nm and 2 mm.

12. The method of claim 11, wherein the developing the resist layer comprises applying electron beam lithography to the layer of PMMA and developing the PMMA with an organic solvent.

13. A method of forming a semiconductor structure, comprising:
forming a hardmask layer directly above an underlayer, wherein the hardmask layer is a layer of magnesium oxide (MgO) having a thickness between 1 nm and 10 nm, and wherein the forming comprises forming the layer of MgO on the underlayer using a technique selected from the group consisting of ion-beam-assisted deposition, magnetron sputtering, metal organic chemical vapor deposition, and electron beam evaporation;
depositing a resist layer above the hardmask layer for patterning the hardmask layer;
patterning the hardmask layer by etching the layer of MgO with water at room temperature to form a first plurality of trenches in the hardmask layer that exposes portions of the underlayer;
etching the exposed portions of the underlayer to form a second plurality of trenches having an aspect ratio of 5:1; and
removing remaining portions of the hardmask layer by rinsing the remaining portions of the hardmask layer with a rinsing solution.

14. The method of claim 13, further comprising applying ultrasonic agitation during the etching the layer of MgO.

15. The method of claim 13, wherein the rinsing the remaining portions of the hardmask layer with is performed for 1-15 min.

16. The method of claim 13, wherein the etching the exposed portions of the underlayer is conducted using reactive ion etching with a fluorinated gas including sulfur hexafluoride.

17. The method of claim 13, wherein the rinsing solution is an aqueous solution, and wherein the removing the remaining portions of the hardmask layer comprises at least one operation selected from the group consisting of heating the rinsing solution to a temperature between 30° C. and 99° C., applying ultrasonic agitation, and dissolving hydrofluoric acid in the aqueous solution.

18. A method of forming a semiconductor structure, comprising:
forming a hardmask layer directly above a semiconductor substrate, wherein the hardmask layer is a layer of magnesium oxide (MgO) having a thickness between 1 nm and 10 nm, and wherein the forming comprises forming the layer of MgO on the semiconductor substrate using a technique selected from the group consisting of ion-beam-assisted deposition, magnetron sputtering, metal organic chemical vapor deposition, and electron beam evaporation;
depositing a resist layer directly above the hardmask layer for patterning the hardmask layer;
patterning the hardmask layer by etching the layer of MgO with water at room temperature to form a first plurality of trenches in the hardmask layer that expose portions of the semiconductor substrate;
etching the exposed portions of the semiconductor substrate to form a second plurality of trenches having an aspect ratio of 5:1; and
removing remaining portions of the hardmask layer by rinsing the remaining portions of the hardmask layer with a rinsing solution.

19. The method of claim 18, wherein the etching the exposed portions of the semiconductor substrate is conducted using reactive ion etching with a fluorinated gas including sulfur hexafluoride.

20. The method of claim 18, wherein the rinsing solution is an aqueous solution, and wherein the removing the remaining portions of the hardmask layer comprises at least one operation selected from the group consisting of heating the rinsing solution to a temperature between 30° C. and 99° C., applying ultrasonic agitation, and dissolving hydrofluoric acid in the aqueous solution.

* * * * *